(12) United States Patent
van Zon et al.

(10) Patent No.: US 7,705,586 B2
(45) Date of Patent: Apr. 27, 2010

(54) MAGNETIC SENSOR FOR INPUT DEVICES

(75) Inventors: Hans van Zon, Waalre (NL); Jaap Ruigrok, Asten (NL); Jan C. van der Hoeven, Veldhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/576,140

(22) PCT Filed: Sep. 19, 2005

(86) PCT No.: PCT/IB2005/053060

§ 371 (c)(1),
(2), (4) Date: Oct. 12, 2007

(87) PCT Pub. No.: WO2006/035342

PCT Pub. Date: Apr. 6, 2006

(65) Prior Publication Data

US 2008/0116885 A1    May 22, 2008

(30) Foreign Application Priority Data

Sep. 27, 2004  (EP) ................... 04104681
Oct. 22, 2004  (EP) ................... 04105256
Dec. 20, 2004  (EP) ................... 04106743

(51) Int. Cl.
*G01R 33/06* (2006.01)
(52) U.S. Cl. ............................... 324/207.21
(58) Field of Classification Search ............. 324/207.21
See application file for complete search history.

(56) References Cited

U.S. PATENT DOCUMENTS

| 4,500,867 | A | 2/1985 | Ishitobi et al. |
| 6,326,781 | B1 * | 12/2001 | Kunde et al. ............ 324/207.21 |
| 6,501,271 | B1 | 12/2002 | Lenssen et al. |
| 2003/0101553 | A1 | 6/2003 | Itoigawa et al. |

FOREIGN PATENT DOCUMENTS

| DE | 1910601 A | 9/1970 |
| DE | 288009 A5 | 3/1991 |
| DE | 4317512 C2 | 12/1994 |

\* cited by examiner

*Primary Examiner*—Reena Aurora

(57) ABSTRACT

In an example embodiment, a magnetic sensor has a magnet and a magneto-resistive, arranged on a substrate such that magnetic field lines through the magneto-resistive element are substantially parallel to a plane of the substrate. Movement of a movable magnetically permeable element MMPE near the substrate is detected as it alters the number of field lines through the element. The MMPE can be more sensitive than devices arranged with perpendicular field lines, and can be easier to manufacture and integrate. Applications include analog pointers, pressure sensors and microphones. The MMPE can use magnets placed either side of the element to detect changes in size of a gap above the element. As the gap closes, less of the parallel oriented field passes through the magneto resistive element.

20 Claims, 5 Drawing Sheets

Single element

Meander

Vertical shield movement

Horizontal shield movement

Sandwiched shield

MAGNETIC SENSOR FOR INPUT DEVICES

This invention relates to magnetic sensors for sensing movement and/or position, to modules including such sensors, to pressure sensors, to microphones, to accelerometers and to computer input devices having such magnetic sensors, and to methods of manufacturing such sensors or modules.

Especially in portable PC's but also in small handheld electronic devices like mobile telephones, PDA's, digital cameras or GPS devices an analogue pointing device (joystick) functionality is desired. Such a device is more complex than for example a discrete pointing device which merely acts as a switch in the two main directions (X and Y). Various devices are already known such as e.g. piezo-electric devices, optical pointing devices or devices based on strain gauges. Piezo-electric and strain-gauge pointing devices require a complex micro-controller to compensate for the drift in the sensor. Optical pointing devices such as the Philips Laser Beetle are available but have a relatively high power consumption. Magnetic pointing devices are known which can be simpler in construction, can use relatively simple electronics, and have low power consumption. E.g. it is known from patent DE 4317512 to use magneto-resistive sensors on a substrate to measure changes in the direction of a magnetic field originally perpendicular to the substrate generated by a fixed permanent magnet underneath the substrate. This enables contactless measurement of e.g. a zero point, a position or an angle of an object such as a joystick. The substrate has AMR (Anisotropic Magneto-Resistive) sensors distributed in two dimensions which can be connected to read circuitry. The magnetically permeable joystick moves laterally above the sensor surface in an X-Y plane. The sensors are arranged as four MR stripes connected together in a Wheatstone bridge configuration. The bridge is unbalanced by changes in resistance of the sensors, caused by changes in the direction of the originally perpendicular field caused by the lateral movement of the joystick.

It is also known from U.S. Pat. No. 6,501,271 to have Giant Magneto-Resistive (GMR) sensors arranged in a Wheatstone bridge configuration to enable a compensation for temperature changes It is also known from US application 2003/0101553 to provide a GMR detector for reliable detection of insertion of a metallic plate into a slot of a buckle. A permanent magnet and the GMR sensor are provided on either side of the slot. The insertion of the plate acts as a shield interrupting the magnetic field lines across the slot.

An object of the invention is to provide improved apparatus or methods, especially sensors for sensing movement and/or position, to modules including such sensors, to pressure sensors, to accelerometers, to microphones and to computer input devices having such sensors, and to methods of manufacturing such sensors or modules.

According to a first aspect, the invention provides a magnetic sensor comprising a magnetic field generator and a magneto-resistive element, arranged on a substrate such that the magnetic field lines from the generator passing through the magneto-resistive element are substantially parallel to a plane of the substrate, wherein the magnetic sensor comprises a movable magnetically permeable element. The moveable magnetically permeable element is arranged so that it at least partially diverts the field lines of the field generator. Therefore its presence and its movement or displacement affects the magnetic field sensed by the magneto-resistive element. The moveable element acts as a magnetic shunt. The magnetic field sensed by the magneto-resistive element influences the electrical characteristics of the magneto-resistive element, in particular its resistance. Therefore, changes in the magnetic field due to changes in the position of the shield can be measured.

This sensor arrangement can be used for detecting static position as well as changes in the static position of the magnetically permeable element. The movable magnetically permeable element can be independent from the substrate or can be mechanically coupled to the substrate (e.g. the moveable magnetically permeable element can be formed as and act as a membrane), to allow a component of movement perpendicular to the plane of the substrate. This is the most sensitive arrangement.

The movable magnetically permeable element can also be arranged, e.g. mechanically coupled to or independent from the substrate to allow a static position or changes in static position parallel to the plane of the substrate. This arrangement is less sensitive but provides additional opportunities for creating useful devices.

The movable magnetically permeable element preferably comprises a soft magnetic material.

The magnetic permeability of the movable element is preferably larger than the magnetic permeability of the magneto-resistive element, so that the magnetic field lines from the generator at least partially divert through the magnetically permeable element instead of going completely through the magneto-resistive element.

The magnetic field generator may be arranged on the same side of the substrate as the magneto-resistive element. This allows an easier manufacturing compared to placing a magnet at the backside of the substrate and a reduction of the size of the sensor, especially when the permanent magnets are made in thin-film technology. The magnetic field generator may have a pair of electromagnets or permanent magnets on either side of the magneto-resistive element. This arrangement can help in keeping the size of the magnets small for ease of integration, while keeping more of the magnetic field parallel to the plane of the substrate.

The sensor can be used with movable magnetically permeable elements located out of the plane of the sensor such that as the movable magnetically permeable element approaches the sensor, more of the magnetic field lines pass through the movable magnetically permeable element, and less pass through the magneto-resistive sensor element. Compared to known arrangements in which the movable magnetically permeable element is between the magnet and sensor, and/or the magnet is beneath or above the sensor, this new arrangement can enable the magnetic field generator for the sensor to be on the same substrate and therefore manufactured more easily and cost effectively.

There are various ways to readout the signal of the sensor. The magneto-resistive element may act as a resistor of which the resistance value changes when the magnetically permeable element changes its distance to the sensor. This resistance change may be readout by any suitable means.

Another such additional feature is that the magneto-resistive element comprises AMR material such as $Ni_{80}Fe_{20}$ or $Co_{90}Fe_{10}$. These are relatively simple to grow and pattern and are cost effective.

Another such additional feature is that the magneto-resistive element comprises GMR material. These materials are in general more sensitive but more complex to grow and pattern.

The magneto-resistive element preferably comprises strip portions, the strip portions having a longitudinal direction substantially perpendicular to the direction of the magnetic field lines. In such an arrangement the resistance of the magnetoresistive element is directly changed by the change in the magnetic field.

Another such additional feature is that a strip direction is aligned along the direction of the magnetic field lines. This changes the sensitivity of the sensor which in case of GMR material also leads to a change in resistance indirectly.

A further feature is that a joystick or pointer can be constructed. The joystick comprises the magnetic permeable surface which is pivoted. At least one) magneto-resistive element is arranged underneath the pivoted surface so that part(s) of the movable magnetically permeable element move(s) substantially perpendicular to the plane of the magneto-resistive element. The moveable element is pivotable so that a tilt is converted in a movement of part of the movable element in a direction substantially perpendicular to the plane of the magneto-resistive element.

In an advantageous embodiment two or more magnetoresistive elements are arranged underneath the pivoted surface, so that part of the movable element moves closer to one magneto-resistive element, and the other part of the movable element moves away from the second magneto-resistive element. A differential measurement can be done in this way. The difference in output signals from the first and second magneto-resistive elements is much more accurate and sensitive than in case only one magnetoresistive element is used.

Another such additional feature is the sensor being integrated in a chip package together with the joystick and additional chips such as e.g. a microcontroller.

Another aspect provides a pressure sensor having a movable magnetically permeable element configured e.g. as a membrane, and a sensor configuration as set out above for detecting the static position or the position change of the membrane induced by pressure.

An additional feature is the element comprising a membrane suitable for detecting acoustic waves, e.g. to form a miniature, integrated microphone.

An additional feature is the element comprising a membrane having a certain mass suitable for detecting and measuring acceleration or force to form an accelerometer.

A second aspect provides a method of manufacturing a sensor having the steps of forming a magneto-resistive element and a magnetic field generator on the same substrate, arranged so that magnetic field lines from the generator passing through the magneto-resistive element are substantially parallel to a plane of the substrate, and forming a movable magnetically permeable element. The moveable magnetically permeable element is arranged so that its position or position change affects the magnetic field sensed by the magneto-resistive element. This change of field sensed by the magneto-resistive element alters the electrical characteristics of the magneto-resistive element, e.g. a measurable change in its resistance.

For example, changes in the vertical gap width between the moveable element and the magneto-resistive element can be detected by embodiments having magnets, e.g. permanent magnets or electromagnets placed either side of the magneto-resistive element so that a magnetic field between the magnets passes substantially parallel to a plane of the substrate, and through the magneto-resistive element. As the vertical gap closes, less of this parallel field passes through the magneto-resistive element and more passes through the movable element. The movable element acts as a magnetic shunt.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

How the present invention may be put into effect will now be described by way of example with reference to the appended drawings, in which.

Figure 9A:
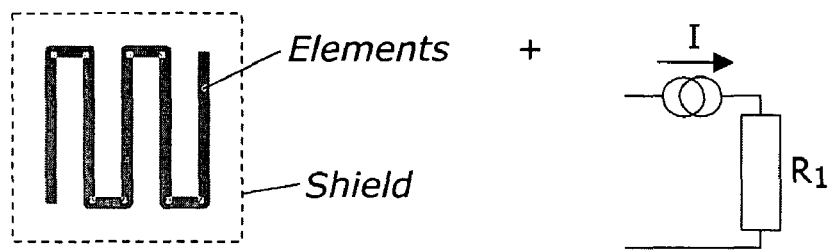
Figure 9B:
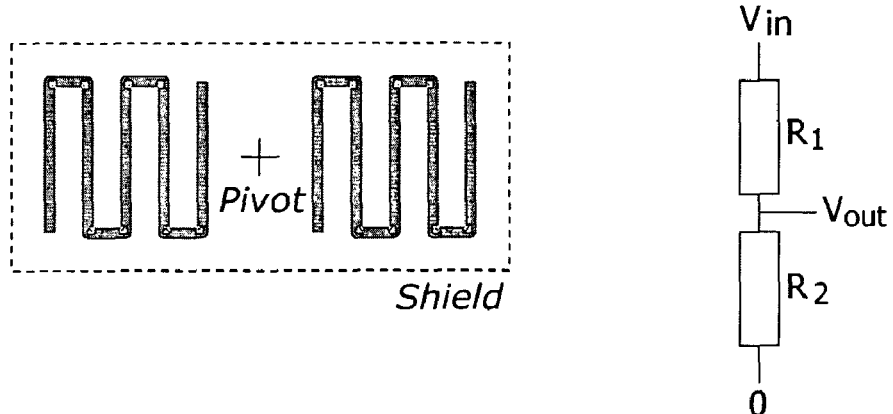
Figure 9C:
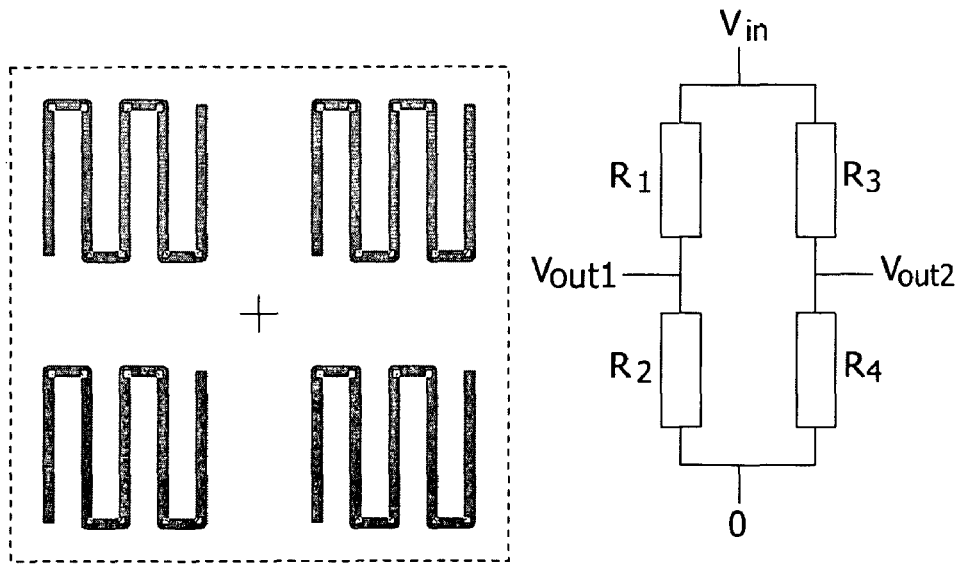

FIG. 9A-C show various arrangements to obtain electrical signals (single resistor, voltage divider, Wheatstone bridge)

FIG. 10A-E show various arrangements of magneto-resistive sensors and permeable shields The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Before describing a first embodiment, to help understand the principles of operation, MR sensors will be introduced briefly. An MR sensor has a resistance which value is dependent on the strength and/or direction of an external magnetic field passing through the plane of the sensor. Different types of MR sensors exist. Sensors based on the anisotropic magneto-resistance (AMR) effect have been used in the early magnetic recording heads and are still being used in sensors for automotive (ABS). AMR sensors comprise magnetic material (e.g. the alloy Ni80Fe20) having anisotropical magnetic properties. The magnetisation direction of this material is influenced by an external magnetic field and the angle between this magnetisation and the current flowing through the material determines the resistance value. Typically the resistance change is 2-4%. The GMR (Giant Magneto-Resistive) sensor comprises a multilayer stack of thin films of which at least one layer has a fixed direction of magnetisation and at least one layer of soft magnetic material of which the magnetic direction can be easily influenced by an external magnetic field. The measured resistance depends on the angle between the magnetisation directions of the fixed and the soft magnetic layer. Typically the resistance change in GMR is 5-15%. A further description of the stack can be found in U.S. Pat. No. 6,501,271 B1 'Robust Giant Magneto Resistive effect type multi layer sensor'. Depending on the geometry, an MR sensor is more sensitive in one direction and less sensitive in another direction in the plane of the sensor. Hence such a sensor has a sensitive direction. A GMR sensor typically is more sensitive than an AMR sensor. By sending a current through the sensor, changes in resistance can be translated into voltage changes which can be easily measured, e.g. with a suitable measuring device.

Another sensor type uses the large tunnel magnetoresistance (TMR) effect. TMR effects with amplitudes up to greater than 50% have been shown, but because of the strong bias-voltage dependence, the useable resistance change in practical applications is typically less than 25%. MTJs basically contain a free magnetic layer, an insulating layer (tunnel barrier), a pinned magnetic layer, and an antiferromagnetic AF layer which is used to "pin" the magnetization of the pinned layer to a fixed direction. There may also be an underlayer and other layers which are not relevant to the principle of operation.

In general, both GMR and TMR result in a low resistance if the magnetisation directions of the fixed and free layer in the multilayer are parallel, and in a high resistance when the orientations of the magnetisations are anti-parallel. In TMR multilayers the sense current has to be applied perpendicular to the layer planes because the electrons have to tunnel through the insulating barrier layer. In GMR (and AMR) devices the sense current usually flows in the plane of the layers. A sensor should preferably have a large susceptibility to magnetic fields, e.g. for high sensitivity, and should have little or no hysteresis.

A magnetic sensor according to one of the above mentioned principles typically consists of material which is patterned into one or more almost rectangular stripes, often connected together in the shape of a meander to achieve a certain resistance. In case of the GMR material, the anisotropy axis of the free magnetisation layer in the stack is normally chosen along the axis of the stripe. In order to get the maximum resistance change in a field, the direction of the reference layer is chosen perpendicular to the axis of the strip. In this configuration the magnetic field is also applied perpendicular to the length axis of the strip in order to give the maximum resistance change.

Figure 1:
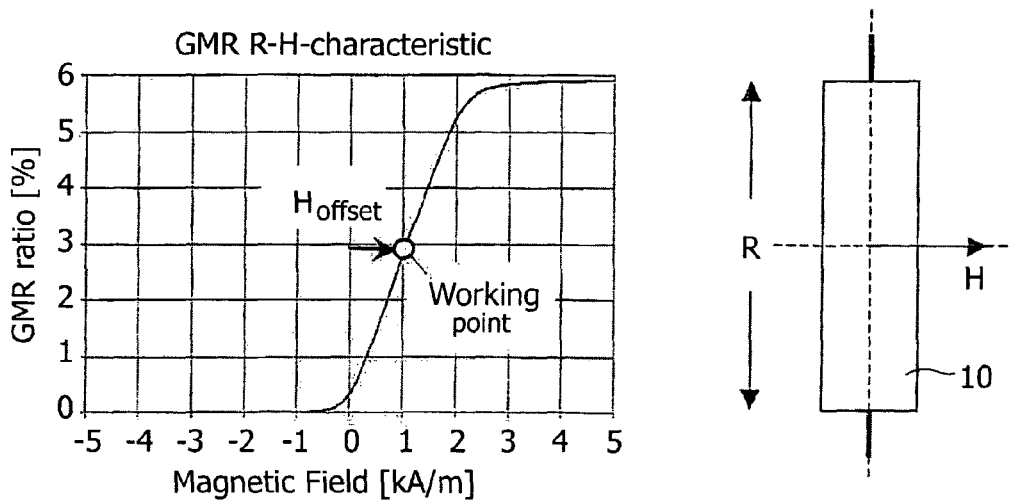
FIG. 1 shows a graph of the normalized change in resistance of a GMR element.

In FIG. 1 the R-H output characteristic of such a GMR sensor element 10 is shown in which the y axis shows the normalized change in resistance R and the x axis shows the applied magnetic field H. The direction of applied magnetic field with respect to the longitudinal direction of the resistor strip is indicated in the diagram on the right hand side of FIG. 1. From FIG. 1 it is clear that the most sensitive and linear part of the GMR characteristic is not around the field H=0 but around some finite offset-field $H=H_{offset}$. This observed shift in the R-H-characteristic is caused by internal magnetic fields and couplings in the GMR stack itself and can be tuned or varied within a certain range to yield a characteristic suitable for a specific application.

The sensitivity of the characteristic is dependent on the geometry of the sensor and therefore also can be adapted to a specific application. In this document, the point of maximum sensitivity and linearity is called the working point of the sensor which is also indicated in FIG. 1. The GMR sensor can be set in its working point by applying a constant magnetic field with a field strength equal to $H_{offset}$ to it. Such an external magnetic field could e.g. be generated by an electromagnet such as a coil integrated together with the GMR stripes or by a set of permanent magnets which are placed around the sensor. These permanent magnets could be single pieces of (hard) magnetic material but it is also possible to use thin film deposition (e.g. sputter deposition of CoPt) and lithography techniques (lift-off) to make integrated permanent magnets onto the chip die itself. This has the advantage of being cheaper than single external magnets, and the alignment of the magnets with respect to the sensor can be much more accurate. This technique of integrated permanent magnets is e.g. known in hard disk and magnetic tape readheads where an integrated magnetic field can be used for the biasing or stabilisation of the magneto-resistive sensor element.

It is clear from FIG. 1 that a variation in the field strength of this magnetic field causes a variation in the resistance of the GMR element. Lower field strengths will reduce the resistance while higher field strengths will increase resistance. Therefore, a modulation of the magnetic field will cause a modulation in the output of the sensor. Embodiments of the present invention are based on sensing such modulations caused by the movement of magnetically permeable element(s) within the magnetic field, i.e. acting as magnetic shunts.

In the following embodiments of the invention will be described in detail. These embodiments disclose magneto-resistive sensors including magneto-resistive elements. In any of the embodiments of the present invention the magneto-resistive element may comprise an AMR, a GMR or a TMR device.

Figure 2:
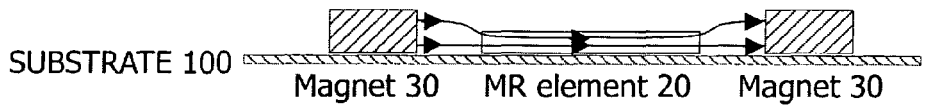
FIGS. 2 and 3 show an embodiment having a MR element enclosed between two (on-chip) permanent magnets.
Figure 3:
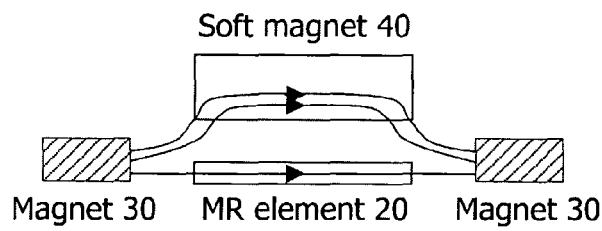

A first embodiment of the invention, illustrated in FIGS. 2 and 3 shows how the sensor and magnetic field generator can be co-planar while the movement or displacement of a movable magnetically permeable element is out of the plane, and diverts magnetic field lines such that they will not pass through the sensor element. The movement or displacement can be in a direction or in any direction and affects the magnetic field lines passing through the sensor, depending largely on how close the movable magnetically permeable element is to the sensor. It can use GMR technology, though other magneto-resistive technologies are included within the scope of the present invention. The magnetic field strength in the sensor element itself is determined by the density of magnetic flux lines which flow through the sensor element. By diverting some of the fluxlines from the sensor element, the magnetic flux density in the sensor element is reduced and hence the magnetic field strength in the element is reduced, which alters its resistance. Such a diversion of the magnetic flux lines can be established by the presence of a piece of soft-magnetic material, i.e. a magnetic shield or shunt with a good magnetic permeability, in the neighborhood of these field lines. Due to the larger permeability and/or volume of the soft-magnetic shield compared to the permeability and/or volume of the sensor, the magnetic resistance of the soft-magnetic shield will be lower than that of the sensor and therefore the magnetic flux lines will prefer to go partially through the soft magnetic shield. Hence the shunting action. This has the effect of reducing the magnetic flux density in the sensor and thus decreasing the magnetic field in the sensor.

A configuration to achieve this effect is sketched in FIG. 2. The sensor has a combination of a MR element 20, and one or more integrated electromagnets or permanent magnets 30, on a substrate 100. The term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or an $Si_3N_4$ layer in addition to a semiconductor substrate portion.

Thus, the term substrate also includes glass, plastic, ceramic, silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer.

Where permanent magnets are used for the magnetic field generator, any suitable permanent magnetic materials with remnant magnetisation may be used. Examples are Co, CoPt, all kinds of hard magnetic ferrites, or even printable magnets like Barium-Hexa-Ferrite.

When combined with a movable element having a soft magnetic layer 40, e.g. to form a shield or shunt, the combination is referred to as a module in this document. Soft magnetic materials suitable for use in any of the embodiments of the present invention, e.g. as a soft magnetic layer 40, are materials that are easily magnetised and demagnetized. They typically have an intrinsic coercivity less than 1000 $Am^{-1}$. Examples of soft magnetic materials that can be used in the invention are e.g. iron-silicon alloys, nickel-iron alloys, amorphous and non-crystalline alloys which may comprise e.g. iron, nickel and/or cobalt with one or more of boron, carbon, phosphorous or silicon, soft ferrites with general formula $MOFe_2O_3$ (wherein M is a transition metal such as e.g. nickel, manganese or zinc), or any soft magnetic material like e.g. $Ni_{20}Fe_{80}$ or other compositions of $Ni_xFe_y$, $Co_{10}Fe_{90}$, Fe, CoNbZr, soft magnetic ferrites and all other suitable soft magnetic materials. Any suitable deposition technique can be used for the soft magnetic materials, e.g. sputtering or electrodeposition.

The module described above can be used in any of the embodiments of the present invention. In each of these embodiments the proximity of the soft magnetic shield relative to the permanent magnets or electromagnets and the sensor element is altered in some way, so as to alter the field. This effect on the sensor element is most sensitive to vertical proximity, but is also sensitive to movement in any other direction particularly if the shield is small with respect to the magnet and the sensor. Given a certain geometrical configuration of permanent magnets, shield and sensor element, the equilibrium position of the magnetic shield may be set such that the sensor element is operating at its desired working point. When the soft magnetic shield is positioned closer to the MR sensor, as shown in FIG. 3, more magnetic flux lines will flow through the shield, thereby decreasing the magnetic field which is felt by the sensor. The resistance of the sensor will decrease. Increasing the distance between shield and sensor has the opposite effect and more magnetic flux lines will flow through the sensor element resulting in an increase of magnetic field and thus of the resistance.

Figure 4:
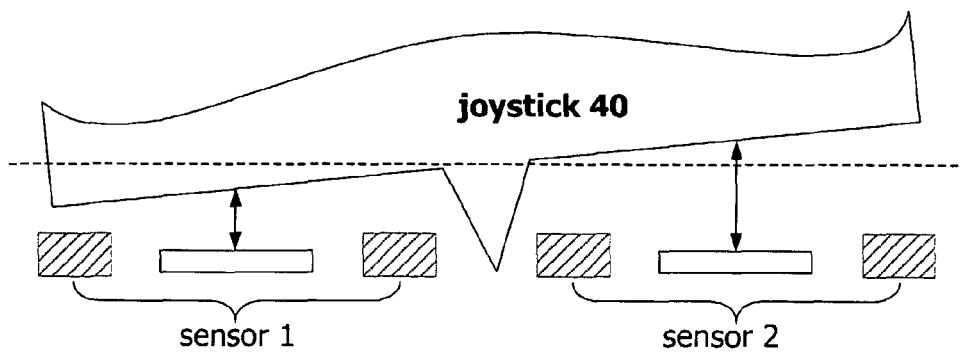
FIG. 4 shows an embodiment showing a pivoted analog joystick.

The principles shown in FIGS. 2 and 3 can be applied to a pointing device, e.g. an analogue joystick using a magnetic sensor for any devices with a display such as mobile phones and Personal digital assistants (PDA's). In other magnetic devices, vertical magnetic field lines are generated by an external permanent magnet which is placed underneath the sensor die and are bent from their vertical direction by means of a magnetically permeable joystick. The horizontal component of these bent field lines is measured by the sensor. This has the disadvantage of using a single permanent magnet which cannot be integrated onto the die. Moreover, accurate alignment of the permanent magnet with respect to the die is necessary. Instead, the module from FIGS. 2 and 3 can be used to make an analogue magnetic joystick without the need for a permanent magnet external to the chip package. A possible configuration is sketched in FIG. 4 showing a joystick 50 having a soft magnetic bottom layer which forms the moveable magnetically permeable element or shield of the present invention, in combination with two identical sensor modules 1 and 2. The sensor modules 1 and 2 react opposite to the tilt of the joystick. Via a proper arrangement, a differential signal can be obtained. This set of modules responds to the tilt in e.g. X-direction. A second set of modules can be made to respond to the Y-direction tilt of the joystick. The joystick is pivoted between the sensors, so that lateral movements are converted into differences in vertical proximity of the soft magnetic bottom layer to the sensors as shown by the arrows. Using the same joystick in combination with four identical modules gives the possibility of detecting both X and Y movement independently. In the joystick embodiment, the soft magnetic shield is implemented as a soft magnetic joystick or at least a joystick which has a soft magnetic part at the bottom. When the joystick is placed in a perfect vertical position, i.e. its equilibrium position, the distance from the soft magnetic shield, formed by the bottom layer of the joystick, to sensor 1, will be equal to the distance from the soft magnetic shield to sensor 2. Therefore the resulting magnetic field strength in both sensors will be the same and thus their resistances will be the same. By converting the resistance of a sensor to a voltage in a suitable transducer and subtracting the voltages of two sensors in a subtracting circuit, an output signal for one direction is obtained. When the joystick is tilted, the distances between the shield and the sensors will change. The direction which shows most difference in resistance will indicate the direction of the tilt of the joystick. Depending on the direction of the tilt of the joystick the output voltage will be either positive or negative. As long as the joystick is perfectly vertical, the resistances of both sensor elements will be the same and the output will be zero. The absolute value of the resistance will be dependent on the equilibrium distance between the bottom plane of the joystick and the sensor element. Of course this distance may vary a little bit due to construction margins in the joystick but as long as the working point is on the linear slope of the R-H characteristic, this will not affect the functioning of the joystick.

In an X-Y pointing device independent signals for the movement in the X-direction and the Y-direction have to be generated. For each direction (X, Y) a Wheatstone bridge configuration consisting of four resistors made of MR material can be used. In one embodiment, the MR sensors are deposited and patterned on the same substrate, a $Si/SiO_2$ substrate for example. The sensor elements can be in two Wheatstone bridges for the X- and Y-direction positioned at 90 degrees with respect to each other. Bridge Y which lies along the Y-direction is sensitive to a change in magnetic field in the Y-direction (e.g. caused by the stick of a pointing device which is positioned above the sensor) while bridge X is sensitive to a change in magnetic field in the X-direction.

In fact two functions can be implemented by such a joystick:

1. By tilting the joystick the sum of the resistances of both sensors stays the same while the difference between the resistances is an indication of the tilt of the joystick.

2. By pressing the joystick in a vertical direction the sum of the: resistances of both sensors decrease while the difference between the resistances stays zero.

Aspects of the present invention include either making a three-dimensional joystick function or a joystick with a mouse button function.

Figure 5:
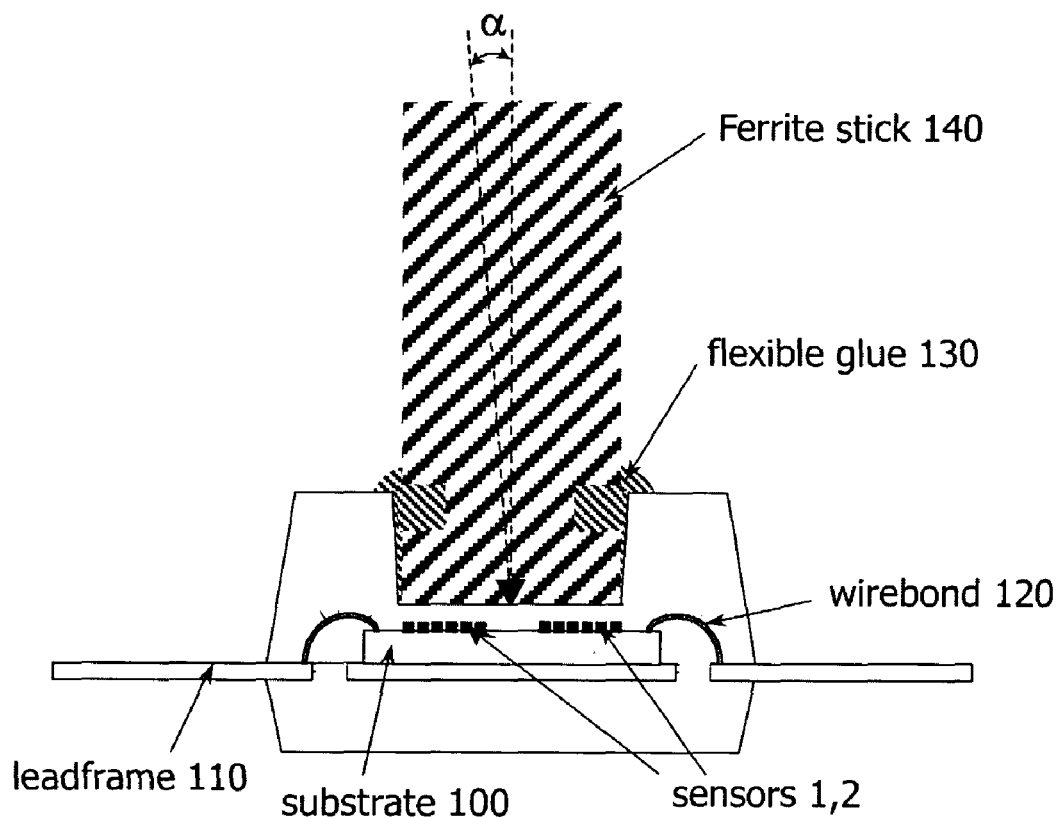
FIG. 5 shows an embodiment of a joystick integrated into a package.

In FIG. 5 a cross-section of an embodiment of a pointing device integrated into a package is shown. It has the magnetic sensors 1, 2 each having their MR element 20, and their electromagnets or permanent magnets 30 and the joystick in the form of a ferrite stick 140 integrated in a chip package. There can be two or more sensor modules arranged around the joystick pivot, e.g. in a ring. They can be electrically coupled in a Wheatstone bridge as described in more detail below, or in other configurations. The package has a substrate 100 such as a chip having integrated circuit elements, which is used also for mounting the sensors. Any of the materials mentioned above may be used as the substrate material. The substrate is mounted on a leadframe 110 with wirebonds 120 for electrical connection. The package is modified in such a way that the stick can be mounted in a blind hole in the package material with a flexible glue 130, an elastomeric ring such as an O-ring or any other mechanical spring. In this way the chip in the package remains protected against moist, dirt, scratches as if it were a normal package. In addition normal reflow soldering processes remain possible. The ferrite stick is mounted to enable some movement, pivoted at the bottom of the blind hole, so that lateral movement near the top of the stick causes it to pivot by an angle α (alpha).

The chip with the magnetic sensor can be on the same chip as signal processing circuitry or placed close to another signal processing chip, e.g. with for example a microcontroller, in the same package, coupled by wirebonds. The short distance between the chips can reduce the influence of noise. Another advantage of using a microcontroller is that it can be programmed to carry out any desired type of I/O signal processing including filtering, comparing to a threshold, amplifying, or compensating for errors for example.

Figure 6:
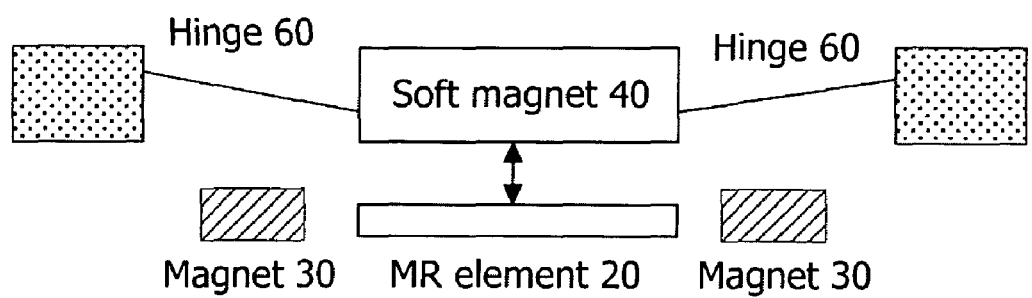
FIG. 6 shows an embodiment of a magnetic microphone or accelerometer using the GMR sensor module with on-chip permanent magnets.

The proposed module can also be used to construct a pressure sensor for various applications including use as a magnetic microphone e.g. for mobile telephone or PDA; or a pressure sensor or an accelerometer. In this particular embodiment (see FIG. 6) the soft magnet shield 40 is held in position by means of elastic hinges 60 or springs to achieve a movable magnetically permeable member. Such hinges or springs can for example be made by means of MEMS-technology to achieve small dimensions and provide a reliable bias force, and enable integration. The stiffness of the hinges and the mass of the soft magnetic shield 40 should be such that acoustic waves produced e.g. by a voice are able to stimulate the soft magnetic shield which acts as a kind of membrane of a microphone. Due to the vibration of the soft magnetic shield, a resistance modulation is induced in the MR element 20 of the sensor, which is easily converted into an output voltage and thus allows reproduction of the sound.

A similar layout can be used as a kind of pressure sensor, either measuring external mechanical force exerted on the soft magnetic shield or measuring the atmospheric pressure, e.g. barometer function or altitude measurement, when the space between the soft magnetic shield and the sensor is at a lower reference pressure. The present invention includes an aneroid barometer with a readout provided by a module in accordance with the present invention which reads out changes in the dimensions of the aneroid bellows. A second module which acts as a reference module can be added to compensate for temperature variations for example.

Figure 7:
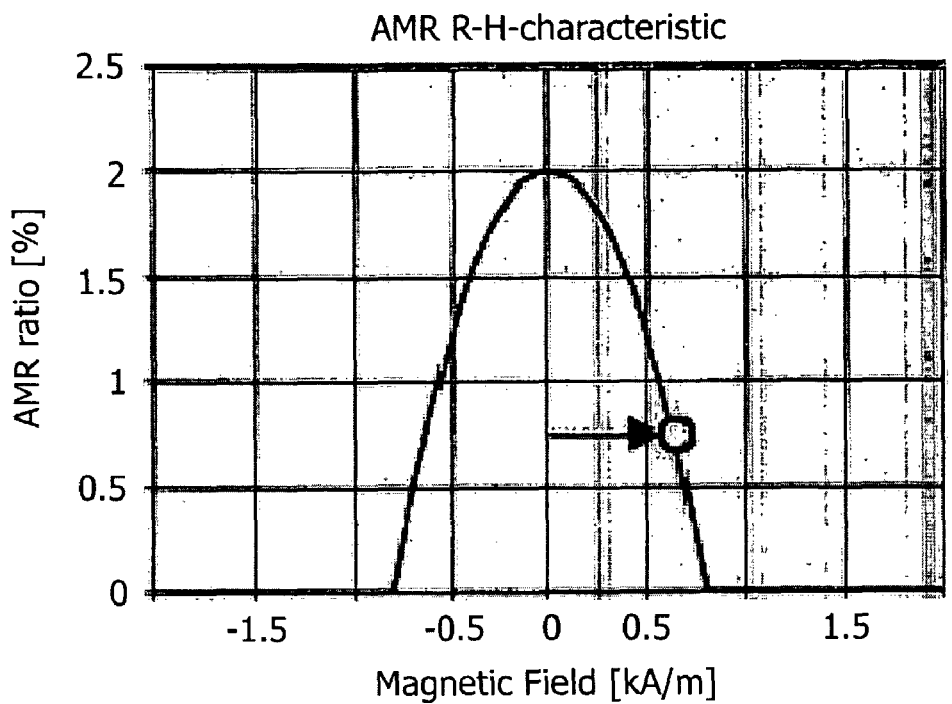
FIG. 7 shows a graph of the normalized change in resistance of an AMR element.

The same concepts as described above can also be used with AMR technology instead of GMR technology, despite the fact that the R-H-characteristic of an AMR sensor is quite different from that of the GMR sensor. FIG. 7 shows the R-H-characteristic of a bare strip of $Ni_{80}Fe_{20}$-material, i.e. without barberpole stripes which are normally used to linearize the characteristic, exhibiting the AMR effect. The bare AMR sensor does not show any sensitivity around zero-field (zero slope at the top of the parabola) but when a permanent bias-field is used, a proper working point for the sensor can be chosen. The characteristic around the working point is less linear than in the case of the GMR sensor.

A sensor can consist of a number of AMR resistors. The resistance value is preferably aimed to be in the kiloOhm range in order to limit the power consumption.

Figure 8:
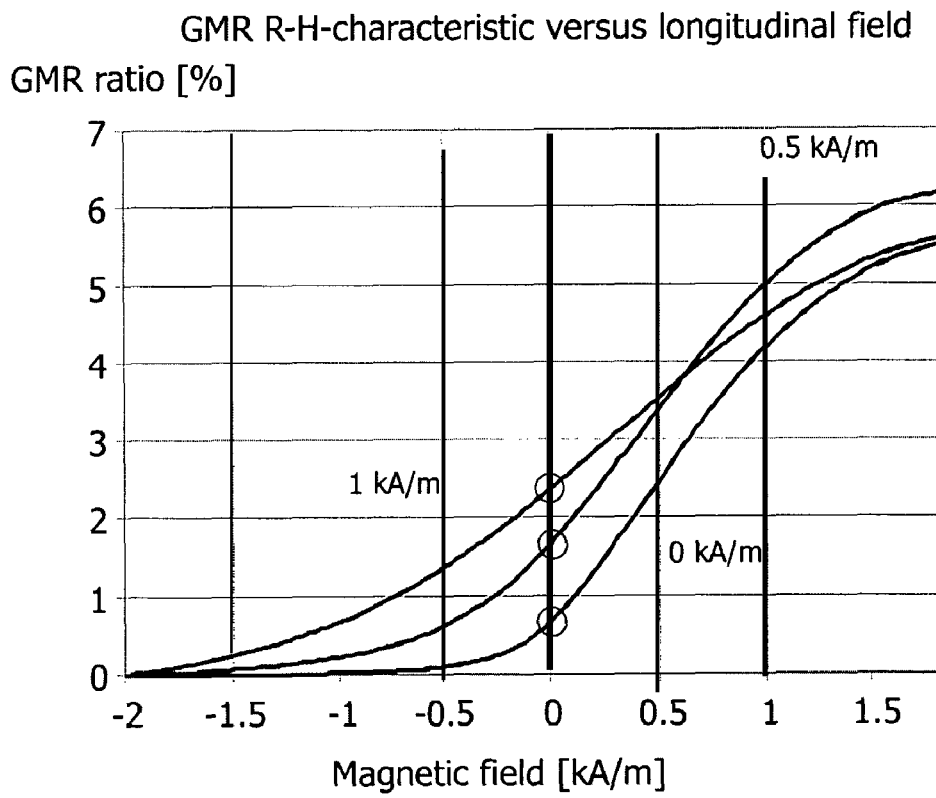
FIG. 8 shows a graph of the normalized change in resistance of a GMR element having a strip direction aligned with the field lines.

In the previous embodiments the imposed magnetic field has been chosen perpendicular to the direction of the strip of magneto-resistive material forming the sensor. In a configuration according to the present embodiment the applied magnetic field works as a bias field which shifts the characteristic of the sensor. By varying the field strength of the bias field the working point moves along the R-H-characteristic. It is, however, also possible to apply the magnetic field along the length direction of the strip. This has the effect of changing the sensitivity of the sensor. A modulation of the field will result in a modulation of the sensitivity of the sensor. Since no other significant magnetic fields are present, the change in sensitivity will affect the resistance of the sensor at the zero-field point (H=0 kA/m). The effect of modulating the magnetic field is shown in FIG. 8. The working point is indicated by the open circle.

There are various ways to readout the signal of the sensor according to any of the embodiments of the present invention. Basically the sensing element is a resistor of which the resistance value changes when the magnetically permeable shield changes its distance to the sensor. Hence any circuitry which can detect the change of resistance can be used with the present invention. Examples are given below with reference to FIG. 9.

In FIG. 9A a single module is shown with a shield, magnets and a magnetoresistive element (single stripe or a meander of stripes) behaving as a resistor R1. If a current from a current source is passed through the resistor R1, the voltage drop across the resistor R1 can be directly measured. Resistance changes will become absolute voltage changes.

In FIG. 9B two modules are shown with a shield, magnets and two magnetoresistive elements, each behaving as a resistor R1 or R2. If the resistances R1 and R2 change differentially, e.g. one goes up while the other goes down when the shield moves, the resistances can be placed in a voltage divider circuit. The two resistances R1 and R2 are placed in series and a fixed absolute voltage is put across the series circuit. Between the resistances, the absolute output voltage can be taken. This circuit has the advantage that the changes in the output voltage are twice as large as in the circuit mentioned above in item 1.

In FIG. 9C four modules are shown including magnets, a shield and four magneto-resistive elements having resistances R1-4 respectively. The resistances R1 to R4 can be placed in a Wheatstone bridge configuration such that e.g. resistances R1 and R4 go up while resistances R2 and R3 go down. This circuit has the advantage that voltage changes are twice as large as in the circuit mentioned above in item 1. The advantage with respect to the circuit mentioned in item 2 is that the output voltage varies around zero volts instead around a certain absolute voltage level. This simplifies electronic signal processing.

It is to be understood that although preferred embodiments, specific constructions and configurations, as well as materials, have been discussed herein for devices according to the present invention, various changes or modifications in form and detail may be made without departing from the scope and spirit of this invention. For example, FIGS. 10A and B indicate possible shapes of the sensor, i.e. merely one stripe 20 of magneto-resistive material (FIG. 10A) or a series of stripes, e.g. in the shape of a meander (FIG. 10B) to increase the resistance of the sensor without taking too much area.

Figure 10A:
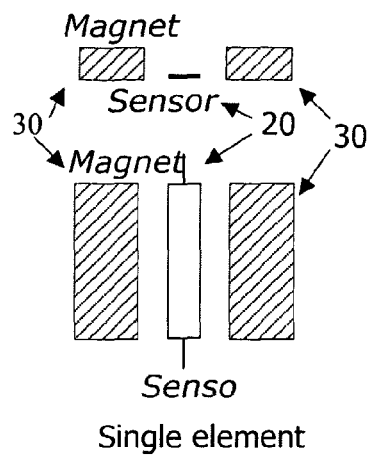
Figure 10B:
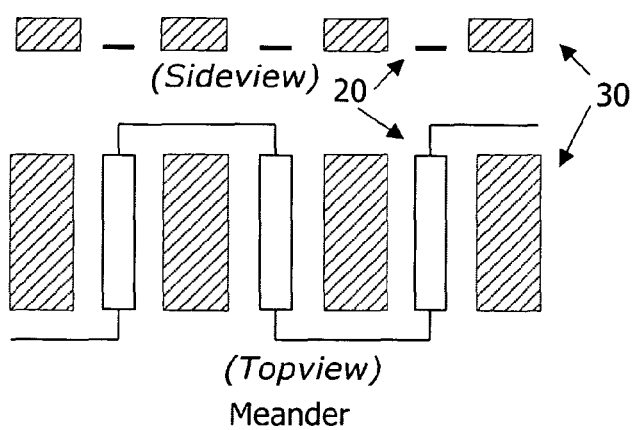

In accordance with embodiments of the present invention it is also possible to detect a horizontal position or movement of the shield with respect to the substrate, although this method will be much less sensitive than that with vertical movement of the shield—see FIG. 10A. If the sensor is arranged like a large meander (see FIG. 10B), so taking up a relatively large area, then the resistance of that meander will depend on the size of the sensor area which is covered by the shield (the shield is larger than the complete sensor area). The resistance will be linearly dependent on the covered area. Hence, the sensor will be sensitive to a horizontal position of the shield. Again the shield can be loose from the substrate or bound to the substrate by elastic hinges.

Figure 10C:
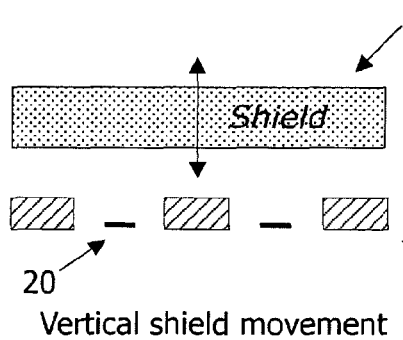
Figure 10D:
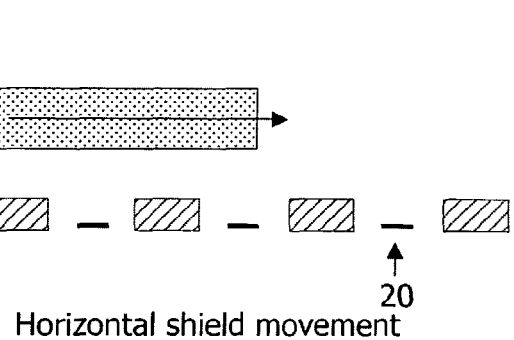

FIGS. 10C and 10D indicate the two possible ways of movement for the moveable soft magnetic element 40, e.g. as a membrane. In FIG. 10C the movement is perpendicular with respect to the sensor 20 and magnets 30 on the substrate. In FIG. 10D the movement is parallel with respect to the sensor 20 and magnets 30 on the substrate.

Figure 10E:
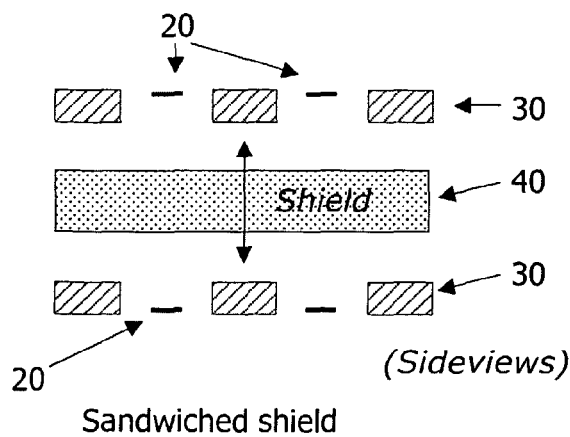

FIG. 10E is another embodiment for making a device in which the magneto-resistive elements 20 alternate. The shield 40 is embedded between two banks of magneto-resistive elements 20 and magnets 30. The shield 40 can move either towards or away from respect bank. While the distance to one bank becomes smaller, it becomes larger to the other bank. Hence the resistance of the one bank of magneto-resistive elements becomes larger/smaller whereas the other becomes smaller/larger.

As has been described above, a magnetic sensor has a magnet field generator (30) and a magneto-resistive element (20), arranged on a substrate such that magnetic field lines through the magneto-resistive element are substantially parallel to a plane of the substrate. Movement of a magnetically permeable element (40) near the sensor is detected as it alters the field strength through the sensor element. Due to the integrated magnet field generator it can be easier to manufacture and integrate. Applications include analog pointers or joysticks for graphical displays, pressure sensors, accelerometers and microphones. It can use magnetic field generators placed at either side of the sensor element and can detect changes in size of a vertical gap between the sensor element and the magnetically permeable element or horizontal movement of the magnetically permeable element with respect to the sensor. As the vertical gap closes or the overlap of the magnetically permeable element changes, less or more of the parallel oriented field passes through the magneto-resistive element. Other variations within the scope of the attached claims can be conceived by the skilled person.

The invention claimed is:

1. A magnetic sensor comprising:
a magnetic field generator; and
a magneto-resistive element, arranged on a substrate such that magnetic field lines from the generator passing through the magneto-resistive element are substantially parallel to a plane of the substrate, wherein the magnetic sensor comprises a movable magnetically permeable element which at least partially diverts the magnetic field lines of the magnetic field generator;
the magnetic field generator being arranged on the same side of the substrate as the magneto-resistive element and the magnetic field generator having a pair of magnets on either side of the magneto-resistive element.

2. The sensor as claimed in claim 1, wherein the movable magnetically permeable element is coupled to the substrate to allow a component of movement perpendicular to the plane of the substrate.

3. The sensor as claimed in claim 1, wherein the movable magnetically permeable element is coupled to the substrate to allow a component of movement parallel to the plane of the substrate.

4. The sensor as claimed in claim 1, wherein the movable element (40) comprises a soft magnetic material.

5. The sensor as claimed in claim 1, wherein a magnetic permeability of the movable element is larger than a magnetic permeability of the magneto-resistive element, so that the magnetic field lines from the generator at least partially divert through the magnetically permeable element.

6. The sensor as claimed in claim 1, in which the magneto-resistive element comprises strip portions, the strip portions having a direction substantially perpendicular to the direction of the field lines of the field generator.

7. The sensor as claims in claim 1, the magneto-resistive element arranged in the neighborhood of the movable element to enable sensing of movement of the movable element in any direction parallel to the plane, the magneto-resistance value being indicative for the position of the movable element.

8. The sensor of claim 1, the movable element being pivotable so that a tilt is converted in a movement of part of the movable element in a direction substantially perpendicular to the plane of the magneto-resistive element.

9. The sensor of 8 being a joystick.

10. The sensor of claim 1, wherein the movable magnetically permeable element functions as a membrane.

11. The sensor as claimed in claim 10 being a pressure sensor.

12. The sensor as claimed in claim 11, being suitable for detecting acoustic waves, to thereby form a microphone.

13. The sensor as claimed in claim 11, being suitable for detecting acceleration forces on the membrane to thereby form an accelerometer.

14. The sensor as claimed in claim 10, being suitable for detecting acoustic waves, to thereby form a microphone.

15. The sensor as claimed in claim 10, being suitable for detecting acceleration forces on the membrane to thereby form an accelerometer.

16. The sensor of claim 1 wherein the pair of magnets of the magnetic field generator are made in thin-film technology.

17. A magnetic sensor comprising:
a magnetic field generator; and
a magneto-resistive element, arranged on a substrate such that magnetic field lines from the generator passing through the magneto-resistive element are substantially parallel to a plane of the substrate, wherein the magnetic sensor comprises a movable magnetically permeable element which at least partially diverts the magnetic field lines of the magnetic field generator;
wherein the movable magnetically permeable element is configured as a soft pressure-sensitive membrane.

18. The sensor as claimed in claim 17 being a pressure sensor.

19. The sensor as claimed in claim 17, being suitable for detecting acoustic waves, to thereby form a microphone.

20. The sensor as claimed in claim 17, being suitable for detecting acceleration forces on the membrane to thereby form an accelerometer.

* * * * *